United States Patent
Zheng

(10) Patent No.: US 7,856,579 B2
(45) Date of Patent: Dec. 21, 2010

(54) NETWORK FOR PERMUTATION OR DE-PERMUTATION UTILIZED BY CHANNEL CODING ALGORITHM

(75) Inventor: Yan-Xiu Zheng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 992 days.

(21) Appl. No.: 11/414,433

(22) Filed: Apr. 28, 2006

(65) Prior Publication Data

US 2007/0255849 A1  Nov. 1, 2007

(51) Int. Cl.
*H03M 13/27* (2006.01)
*H03M 13/45* (2006.01)

(52) U.S. Cl. ...................... 714/701; 714/780
(58) Field of Classification Search ............... 714/701, 714/780
See application file for complete search history.

(56) References Cited

U.S. PATENT DOCUMENTS

| | | | |
|---|---|---|---|
| 4,400,768 A | 8/1983 | Tomlinson | |
| 5,224,100 A | 6/1993 | Lee et al. | |
| 5,530,707 A * | 6/1996 | Lin | 714/792 |
| 5,734,962 A | 3/1998 | Hladik et al. | |
| 5,815,515 A * | 9/1998 | Dabiri | 714/795 |
| 6,044,116 A | 3/2000 | Wang | |

(Continued)

FOREIGN PATENT DOCUMENTS

EP  0 179 401 A2  4/1986

(Continued)

OTHER PUBLICATIONS

Mansour, M., "Unified Decoder Architecture for Repeat-Accumulate and LDPC Codes", 38th Asilomar Conference on Signals, Systems and Computers, Nov. 2004, pp. 527-531.*

(Continued)

*Primary Examiner*—Stephen M Baker
(74) *Attorney, Agent, or Firm*—Alston & Bird LLP

(57) ABSTRACT

A network for channel coding permutation and de-permutation comprises: a first side and a second side, each of which has at least one terminal. The network further comprises: two or more columns of nodes located between the first and second sides. A first column of the columns interfaces the first side, and a second column of the columns interfaces the second side. Each of the columns comprises at least one node. Each node of the columns is connected to a first number of nodes of each of adjacent columns next to the columns. The first number is identical for all the nodes in the network. The nodes which are selected as switches are concurrently controlled to perform switching operations. A method of operating said network comprises the following steps: determining a direction that a data flow flowing from the first side to the second side; determining control elements of control signals; associating each of the control elements to one of the switching operations of the nodes which are selected as switches; providing a control sequence composed of the control signals; providing a data flow to be manipulated; reading at least one control element of the control signals; performing a switching operation of the switching operations for the nodes depending on the at least one control element of the control signals which is read; and transmitting at least one part of the data flow through paths established by the switching operations of the nodes.

46 Claims, 5 Drawing Sheets

U.S. PATENT DOCUMENTS

| | | | |
|---|---|---|---|
| 6,477,680 B2 * | 11/2002 | Mujtaba | 714/795 |
| 6,553,516 B1 | 4/2003 | Suda et al. | |
| 6,603,412 B2 | 8/2003 | Gatherer et al. | |
| 6,618,371 B1 | 9/2003 | Cao | |
| 6,728,927 B2 | 4/2004 | Crozier | |
| 6,745,362 B1 * | 6/2004 | Carlach et al. | 714/755 |
| 6,845,482 B2 | 1/2005 | Yao et al. | |
| 6,944,727 B2 | 9/2005 | Yokokawa | |
| 6,957,375 B2 * | 10/2005 | Richardson | 714/752 |
| 6,961,888 B2 * | 11/2005 | Jin et al. | 714/752 |
| 7,058,874 B2 | 6/2006 | Zhou | |
| 7,137,044 B2 | 11/2006 | Ha et al. | |
| 7,155,642 B2 | 12/2006 | Han | |
| 7,180,968 B2 | 2/2007 | Miyauchi et al. | |
| 2002/0159423 A1 | 10/2002 | Yao et al. | |
| 2003/0002474 A1 | 1/2003 | Alexander et al. | |
| 2003/0041293 A1 | 2/2003 | Zheng et al. | |
| 2003/0058954 A1 | 3/2003 | He | |
| 2003/0154343 A1 | 8/2003 | Yokokawa | |
| 2005/0071727 A1 | 3/2005 | Zheng et al. | |
| 2005/0071728 A1 | 3/2005 | Zheng et al. | |
| 2005/0076286 A1 | 4/2005 | Zheng et al. | |
| 2005/0216700 A1 | 9/2005 | Honary et al. | |
| 2006/0039555 A1 | 2/2006 | Lee et al. | |
| 2007/0011557 A1 | 1/2007 | Zheng et al. | |

FOREIGN PATENT DOCUMENTS

| | | |
|---|---|---|
| EP | 0 313 787 A2 | 5/1989 |
| EP | 0313787 | 5/1989 |

OTHER PUBLICATIONS

Shimizu, S. et al., *A New Addressing Scheme With Reorganizable Memory Structure Basic Principle,* Transactions of the I.E.C.E. of Japan, vol. E65, No. 8, Aug. 1982, pp. 464-471.

Harper, D.T. et al., *Performance Evaluation of Vector Accesses in Parallel Memories Using a Skewed Storage Scheme,* The 13$^{th}$ Annual International Symposium on Computer Architecture, Tokyo, Jun. 1986, pp. 324-328.

Langmaid, R.N., *Versatile Programmable Logic Array,* IBM Technical Disclosure Bulletin, vol. 25, No. 8, Jan.1983, pp. 4445- 4449.

Berrou, C., et al., *Near Shannon Limit Error - Correcting Coding and Decoding: Turbo-Codes(1),* IEEE International Conference on Communications ICC '93, 1993, pp. 1064-1070.

Zheng,Y. et al., *Inter-Block Permutation and Turbo Codes, 3$^{rd}$* International Symp. Turbo Codes and Related Topics, 2003, 44 pages.

Zheng,Y. et al., *Iterative Decoding Algorithm and Terminating Criteria for Inter-Block Permuted Turbo Codes,* The 15$^{th}$ IEEE International Symposium on Personal, Indoor and Mobile Radio Communications (PIMRC 2004), vol. 2, pp. 1116-1120.

3GPP TS 25.212 version 3.1.1, Multiplexing and channel coding [FDD], Dec. 1999.

* cited by examiner

NETWORK FOR PERMUTATION OR DE-PERMUTATION UTILIZED BY CHANNEL CODING ALGORITHM

BACKGROUND OF THE INVENTION (A) Field of the Invention

The present invention relates to a network for permutation or de-permutation, especially a network for permutation or de-permutation utilized by channel coding and a channel coding security concept thereof.

(B) Description of Related Art

Turbo Code (TC), which is an example of the so-called channel coding, was invented in 1993 and can produce a near Shannon limit performance by applying an iterative decoding algorithm. In co-pending U.S. patent application U.S. Ser. No. 11/176,829 by Zheng et. al., innovative encoder and decoder designs were presented with real-time performance, wherein inter-sequence permutation and intra-sequence permutation are both utilized. Conventionally, many algorithms, e.g. lookup tables, can be used in performing permutations, but they are either complex or inflexible. Therefore, it may be desirable to have a simple or flexible algorithm for channel coding permutation and de-permutation.

The present invention provides an innovative but simple algorithm and hardware architecture for performing inter-sequence permutation at either the encoder end or decoder end with this concept. Preferably, the channel coding applying this concept is referred as "ZYX code" hereinafter.

SUMMARY OF THE INVENTION

The present invention relates to a network for channel coding permutation and de-permutation. The network comprises a first side and a second side. Each of the first and second sides has at least one terminal. The network further comprises: two or more columns of nodes located between the first and second sides. A first column of said columns interfaces the first side, and a second column of said columns interfaces the second side. Each of said columns comprises at least one node (104). Each node of said columns is connected to a first number of nodes of each of adjacent columns to said columns. The first number is identical for all the nodes in the network. The nodes that are selected as switches are concurrently controlled to perform switching operations.

The present invention further relates to a method of operating said network. The method comprises the following steps:

Step (a): determining a direction that a data flow flowing from the first side to the second side through the network;

Step (b): determining control elements of control signals, and the quantity of the control elements corresponds to said first number;

Step (c): associating each of the control elements to one of the switching operations of the nodes which are selected as switches;

Step (d): providing a control sequence composed of the control signals arranged in a row;

Step (e): providing a data flow to be manipulated;

Step (f): reading at least one control element of the control signals for all the nodes;

Step (g): performing one identical switching operation of the switching operations for the nodes depending on the at least one control element of the control signals which is read; and Step (h): transmitting at least one part of the data flow from the first side to the second side through paths established by the switching operations of the nodes.

It should be noted that the letters assigned to each of the steps above are for distinguishing between the steps only, not implying the order of operation. Various embodiments and modification, which do not exceed the scope of the present invention, will be disclosed in "DETAILED DESCRIPTION OF THE INVENTION" below.

BRIEF DESCRIPTION OF THE DRAWINGS

The present invention is described below by way of examples with reference to the accompanying drawings which will make it easier for readers to understand the purpose, technical contents, characteristics and achievement of the present invention. Please note that all lines of connections in the drawings only intercept and contact each other at nodes.

DETAILED DESCRIPTION OF THE INVENTION

Figure 1:
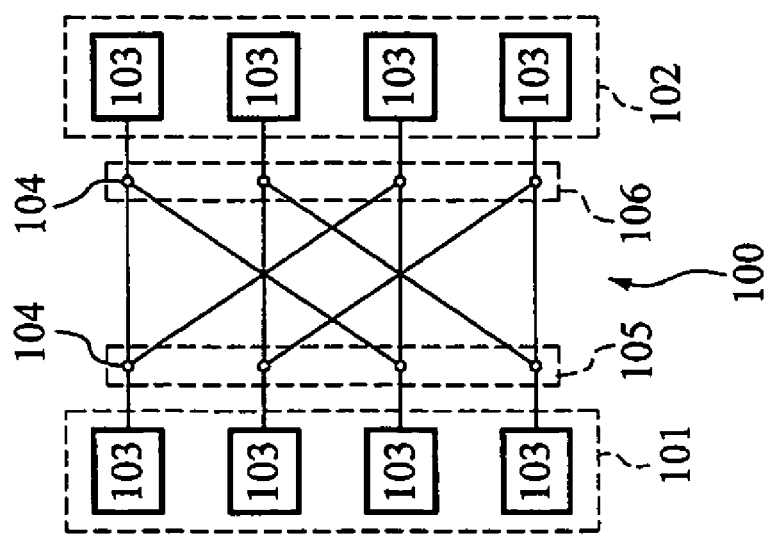
FIG. 1 is a network according to the first embodiment of the present invention.

Please refer to FIG. 1, which is a network according to the first embodiment of the present invention. In the first embodiment, a basic structure of a network (100) is presented, which comprises a first side (101) and a second side (102). Each of the first side (101) and second side (102) has 4 terminals (103). The network (100) comprises: two columns (105, 106) of nodes (104) located between the first and second sides (101, 102). A first column (105) interfaces the first side (101), and a second column (106) interfaces the second side (102). Each of the columns (105, 106) comprises 4 nodes (104); wherein each node (104) is connected to a first number of nodes (104) (for example 2) of each of columns adjacent to the columns (105, 106), and said first number is identical for all the nodes in the network (100). The nodes that are selected as switches are concurrently controlled to perform switching operations.

Although each of the columns (105, 106) comprises a second number of nodes in the first embodiment, which is identical for each of said columns, the second number can be different for each column in some embodiments. One reason for making the second number different for each column is memory management, and part of such embodiments will be discussed later in the specification.

Between the nodes (105, 106) and the terminals (103), certain logics of connection exist. For example, the terminals of the first side (101) and second side (102) can have an exclusive node in the first column (105) and second column (106) respectively, and each of the terminals is connected to each of the exclusive nodes. That is, one terminal is connected to only one node and this node is exclusively connected to this terminal in the present embodiment. However, exceptions exist, for example, for the purpose of memory management, which will also be discussed later in the specification.

In the first paragraph of "DETAILED DESCRIPTION OF THE INVENTION", a person of ordinary knowledge in related fields should understand that connections between nodes, and between nodes and terminals are not limited to the embodiment. For example, referring to FIG. 2, the network in FIG. 1 can be expanded to comprise more columns, or Omega network in FIG. 3 can be adopted instead. In addition, ordinary Benes network and a fat tree network are two possible alternatives. Even a network interiorly applying a p-by-p fully connected switching instead of a 2-by-2 fully connected switching can be used, where p is a positive integer. For example: Winograd Fourier Transform uses a network which applies p-by-p fully connected sub-network. It is easy to understand that many alternative patterns of connections all fall within the scope of the present invention as long as essential elements in the appended independent claims are utilized.

Also in the first paragraph of "DETAILED DESCRIPTION OF THE INVENTION", the nodes that are selected as switches are concurrently controlled to perform switching operations. Take the embodiment in FIG. 1 for illustration, assuming a direction of a data flow is from the first side (101) to the second side (102), the nodes selected as switches are the nodes of the first column (105), wherein every node has two different switching operations because every node of the first column (105) has two choices (flowing horizontally or obliquely) to output the data flow through the network. One advantage of the present invention is its simplicity, because all nodes are concurrently controlled to perform one of possible switching operations, which will be explained later in detail.

One skilled in the art may have noted that every node of the second column (106) has only one choice to output the data flow through the network. Therefore, every node of the second column (106) does not serve as a switch. However, some or all of the nodes of the second column (106) may serve as switches if said some or all of the nodes outputting data to more than one terminal (103) in some embodiments.

The terminals of the first side (101) can be intra-block permuters and the terminals of the second side (102) are memory buffers, or vice versa.

The terminals of the first side (101) can be a posteriori probability (APP) decoders and the terminals of the second side (102) are memory buffers, or vice versa.

Figure 2:
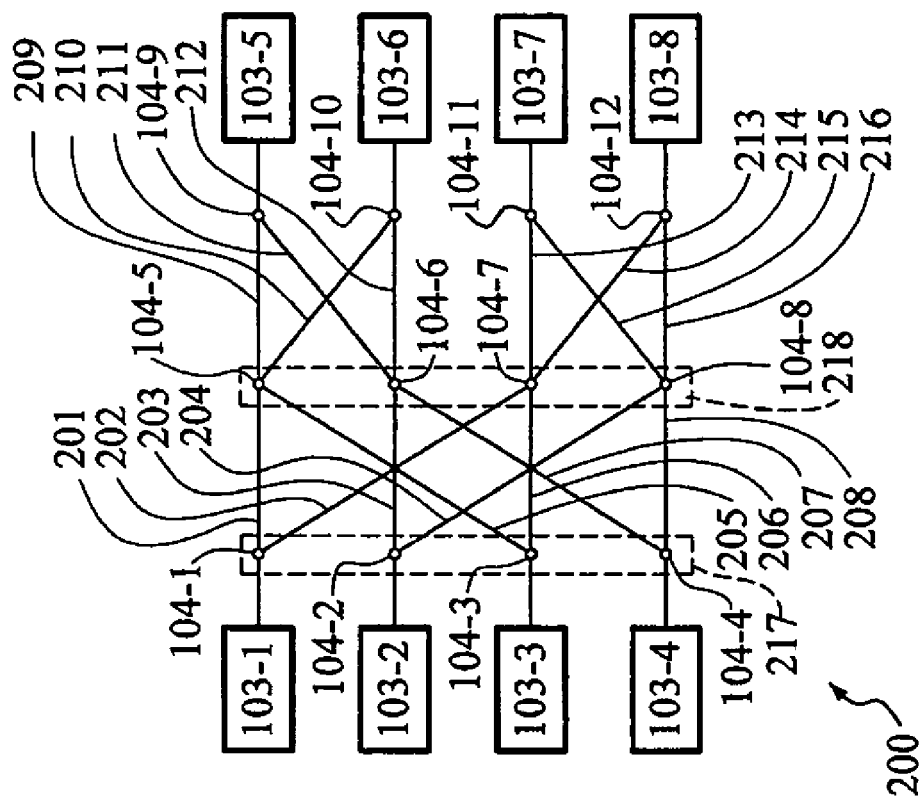
FIG. 2 is an expanded network according to the second embodiment of the present invention, which adopts three columns of nodes.
Figure 4:
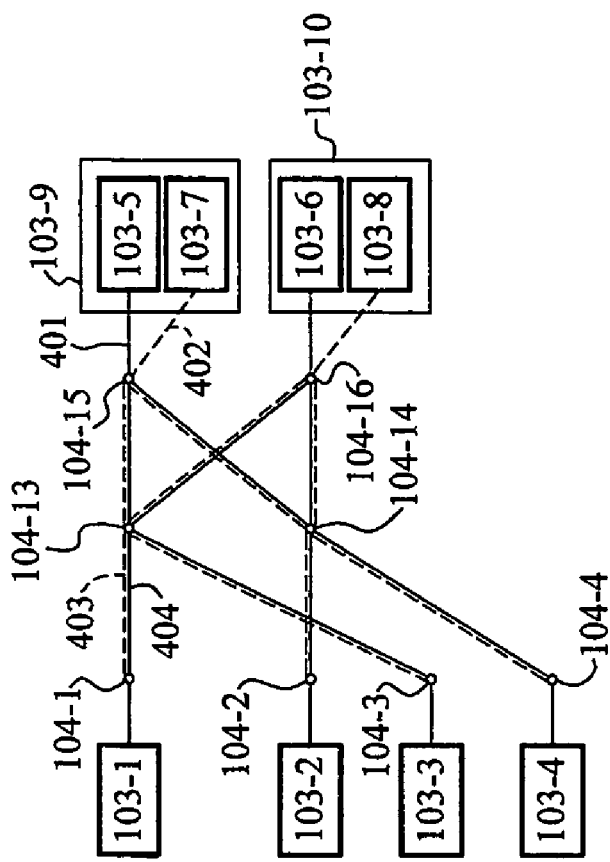
FIG. 4 is an exemplary network of FIG. 2 after "folding and combination."
Figure 3:
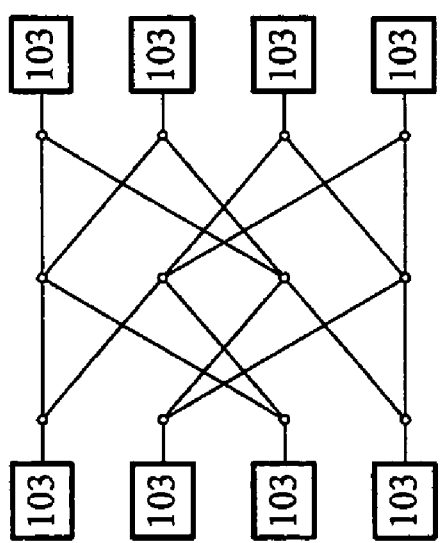
FIG. 3 is a network according to the third embodiment of the present invention, which adopts the Omega network.

For purposes of memory management, cost saving, or space saving, fewer terminals or nodes can be used in the embodiment of FIG. 2 for example, after the procedure of "folding and combination." Please refer to FIG. 2 and FIG. 4 for an example of "folding and combination." The "folding and combination" can be performed on either side of the network but never between sides. That is, terminals (103-1) can be combined with terminal (103-2), (103-3) or (103-4) but never with terminal (104-9), (104-10), (104-11) or (104-12). More clearly, a terminal of the terminals of the first side can be combined with another terminal of the first side, and a terminal of the terminals of the second side can be combined with another terminal of the second side. Accordingly, a node of the nodes in a column of said columns is combined with another node in the same column. A preferred "folding and combination" is shown in FIG. 4, in which the terminal (103-5) is combined with the terminal (103-7), the terminal (103-6) is combined with the terminal (103-8), and the node (104-5) is combined with the node (104-7), the node (104-6) is combined with the node (104-8), accordingly. In FIG. 4, dotted lines represent connections that are moved. Node (104-13) is generated by a combination of nodes (104-5) and (104-7), and so forth for nodes (104-14), (104-15) and (104-16). As for the second side, only two terminals are left now: terminals (103-9) and (103-10), which are combinations of terminals (103-5), (103-7), and terminals (103-6), (103-8), respectively. Take terminal (103-9) of FIG. 4 for example, terminals (103-5) and (103-7) are still represented as individual components in the terminal (103-9). However, practically the terminals (103-5) and (103-7) can be seamlessly merged (or "unified") into the terminal (103-9) and can be distinguished by "mapping", which means, in the case that they are memory buffers, a connection (401) is mapped to access a certain range of addresses (representing terminal (103-5)) and a connection (402) is mapped to another (representing terminal (103-7).) The concept is the same for a terminal (103-10).

Again in FIG. 4, connections between the nodes and the terminals are combined to form a single connection, if the connections overlap and are identical. For instance, under the assumption that the mapping can be done within the terminal (103-9), connections (401) and (402) can be combined into a single connection. Similarly, connections between the nodes are combined to form a single connection, if the connections overlap and are identical. For instance, connections (403) and (404) can be combined into a single connection in FIG. 4. These are conventional techniques and detailed explanation is not necessary.

Figure 5:
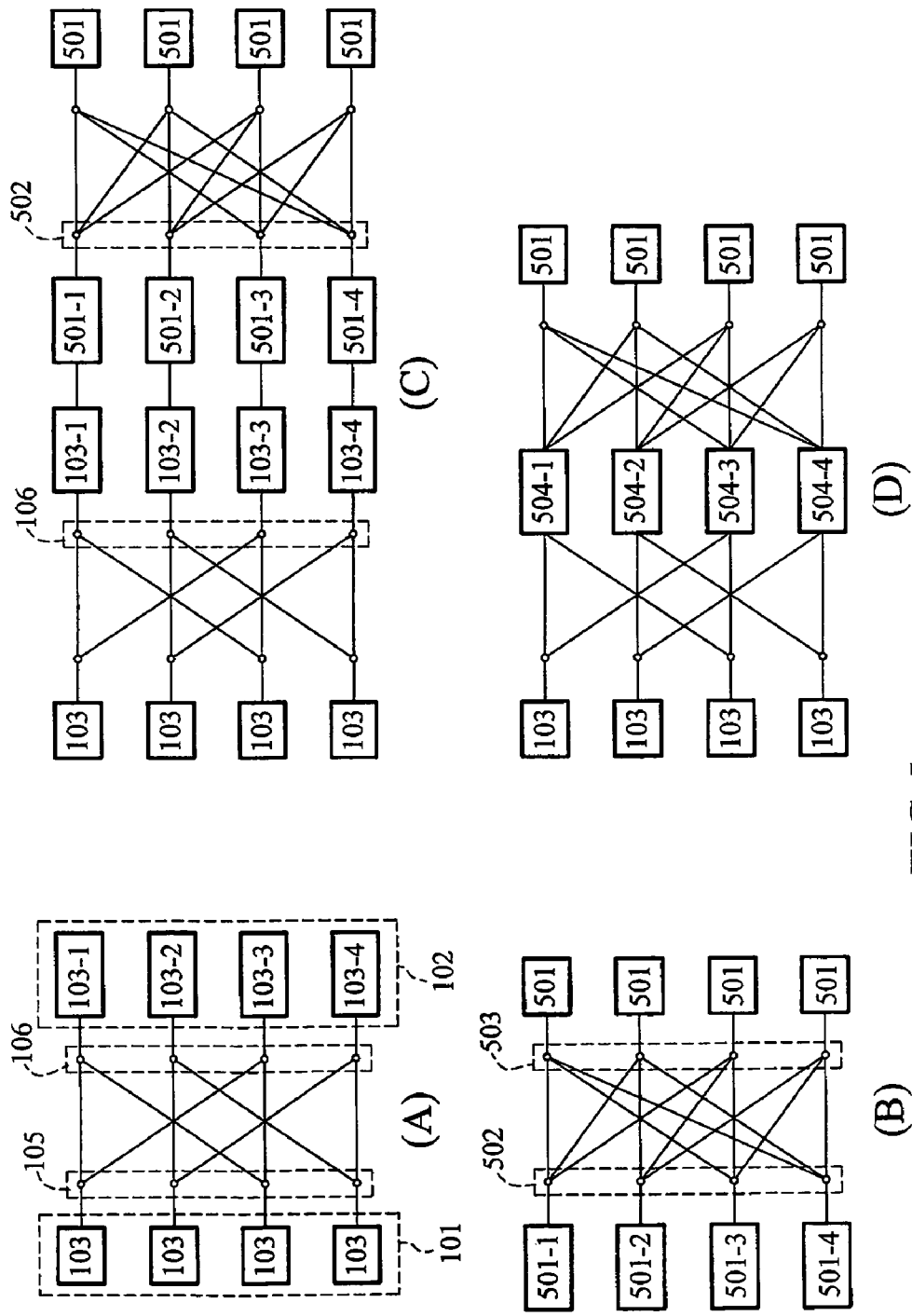
FIG. 5 is an exemplary pipelined-staged network formed by combining two networks at terminals.

As shown in FIG. 5, two or more said networks can be connected to each other in the manner that each terminal of the first side (101) of a network serves to be connected to a terminal of another network at the second side (102), or similarly, each terminal of the second side (102) of a network serves to be connected to a terminal of another network at the first side (101). Sub-drawings (A) and (B) of FIG. 5 illustrate two different networks, which are both covered by the present invention. At sub-drawing (C), terminals (103-1), (103-2), (103-3) and (103-4) of the network in sub-drawing (A) are connected to terminals (501-1), (501-2), (501-3) and (501-4) of the network in sub-drawing (B), respectively. For persons skilled in the art, practically the structure in sub-drawing (C) can be simplified to become the structure of sub-drawing (D) by combining terminals (103-1) with (501-1), (103-2) with (501-2), (103-3) with (501-3), and (103-4) with (501-4). The new nodes after said combination are denoted as (504-1), (504-2), (504-3) and (504-4), respectively. Each of the nodes (504-1), (504-2), (504-3) and (504-4) can work like an ordinary node with switching functions as stated before, or with an additional function of buffering. The network in sub-drawing (D) is often called "pipelined-staged" in the art.

Figure 6:
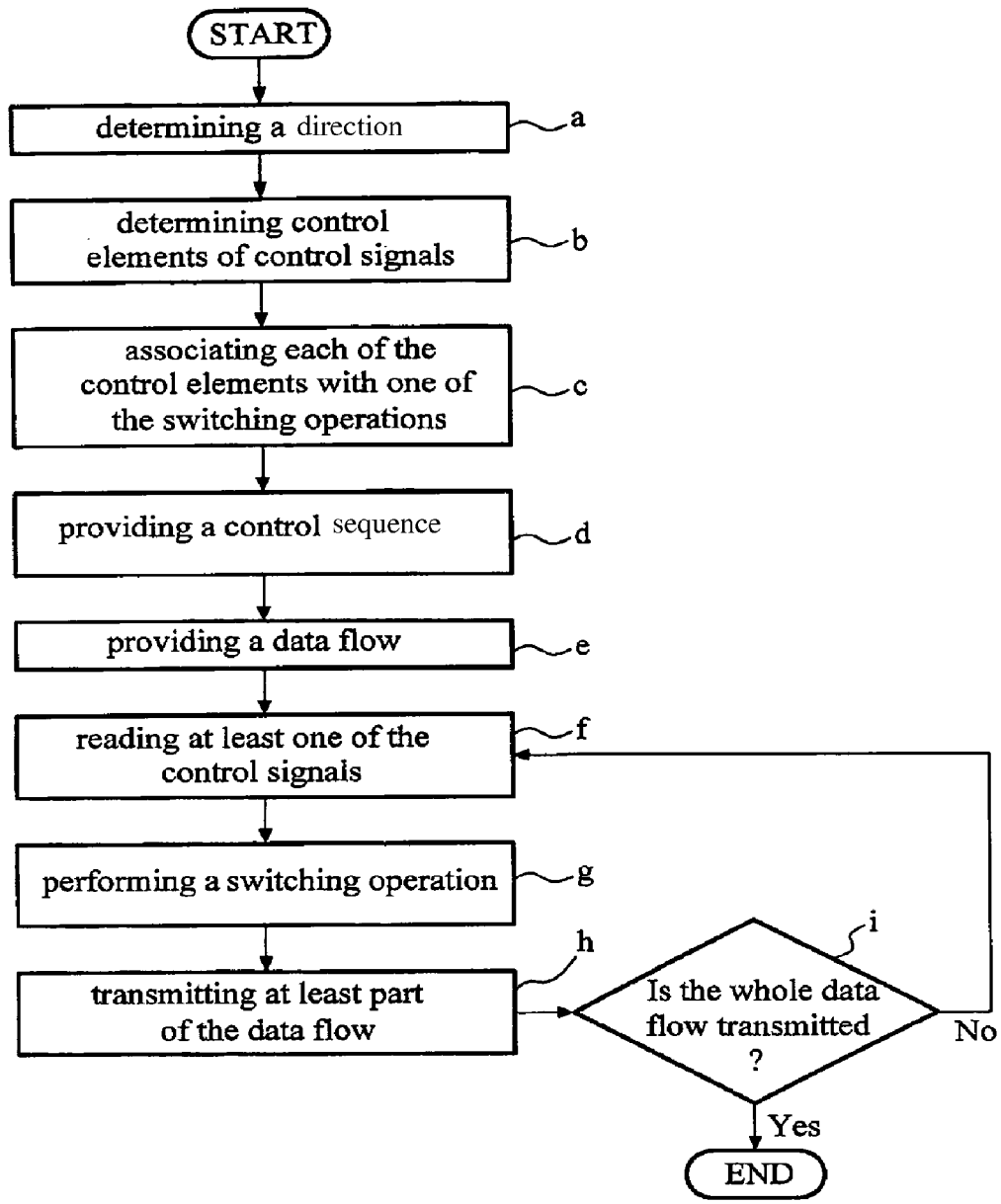
FIG. 6 is a flow chart for a method of the present invention.

The present invention also relates to a method of operating a network. A first embodiment of the method is described by a flow chart in FIG. 6. One should understand that this figure is just an embodiment of this method, and many different orders to perform the steps in FIG. 6 exist with slight differences between each other. For example, the order of operations between steps (a), (b), and (c), and between steps (d) and (e) can be freely adjusted.

Basically, the present embodiment comprises 8 steps as follows.

Step (a):

A direction that a data flow from the first side (101) to the second side (102) through the network (100) is determined. The direction is determined in this embodiment only for ease of illustration. For the network, one should understand that practically the direction can be reversed.

Step (b):

Control elements of control signals, and the quantity of the control elements corresponding to said first number are determined. The control elements determine what can be included in any of the control signals. Each of the control elements can be represented by a binary number, or a number within a limited numerical range or set. For example, in a digital system, the control signals are composed of binary control elements. The control elements are set to be "0" and "1." In some communication systems, the control elements may be chosen within a set of numbers, such as a set of "100", "0" and "−100", in order to alleviate signal deterioration due to the presence of noise.

Step (c):

Each of the control elements is associated with one of the switching operations of the nodes that are selected as switches. For instance, some or all of the nodes of column (105) can be switched to output data through horizontal connections upon receipt of the control element "0" and through oblique connections upon receipt of the control element "1", or vice versa. That is, under the circumstance that all switching nodes on the same column 217 or 218 are set to output data through either horizontally upon receipt of one of the control elements or output data at oblique connection upon receipt of another of the control elements, four sets of available signal paths can be derived from the embodiment shown in FIG. 2. The first set is paths 201, 203, 206, 208, 209, 212, 213 and 216. The second set is paths 201, 203, 206, 208, 210, 211, 214 and 215. The third set is paths 202, 204, 205, 207, 209, 212, 213 and 216. The fourth set is paths 202, 204, 205, 207, 210, 211, 214 and 215. It should be noted that the four sets of paths illustrated above are just an example. For certain purposes, more than one set of paths can be activated at a time. One can assign each of switching nodes within a column different actions upon receipt of an identical control element. For instance, node 104-1 outputs data horizontally and node 104-2 outputs data obliquely both upon receipt of the control element "0." Note that normally the quantity of the control elements equals to the first number for that the first number represents the number of possible choices of the switching operations. Therefore, only one control element is required to control switching of a plurality of nodes.

Step (d):

A control sequence composed of the control signals arranged in a row is provided.

Step (e):

A data flow to be manipulated is input to the network.

Step (f):

At least one of the control signals for all the nodes is read.

Step (g):

According to the control element of the control signals which are read, a switching operation of the switching operations for the nodes is performed.

Step (h):

At least one part of the data flow from the first side to the second side through paths established by the switching operations of the nodes. At step (i), if the data flow is not completely transmitted, normally step (f) is repeated for reading another control signal, and subsequently performing steps (g) and (h) until the whole data flow is transmitted.

Figure 7:
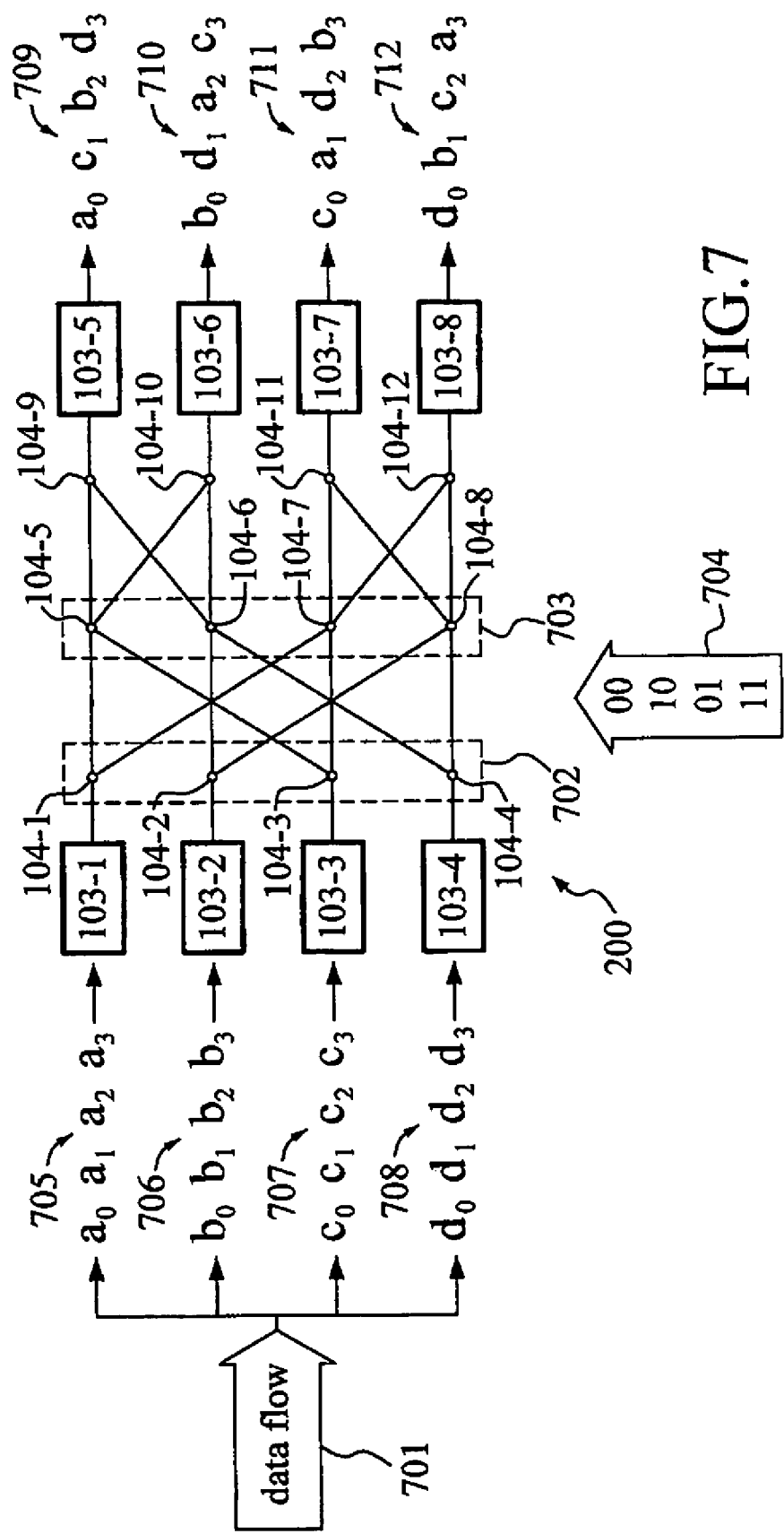
FIG. 7 shows actual operations of the method of the present invention.

An embodiment of an actual operation will be illustrated below with reference to FIG. 7, wherein the network (200) shown in FIG. 2 is again used.

Step (a):

The direction of data flow (701) from the first side to the second side (from left to right) is determined.

Step (b):

The control elements are defined as two-digit binary numbers, i.e. "00", "01", "10" and "11."

Step (c):

The left digit of the control elements is associated with nodes (104-1, 104-2, 104-3, 104-4) of a column (702) and the right digit of the control elements is associated with nodes (104-5, 104-6, 104-7, 104-8) of a column (703). "0" is defined as "flowing horizontally" and "1" is defined as "flowing obliquely."

Step (d):

A control sequence (704) composed of four control elements "00", "10", "01", and "11" in a row is input to the network (200).

Step (e):

A data flow (701) is input to the network (200). Generally, the data flow is formed by a plurality of input sequences (705, 706, 707, 708), and each of the input sequence is formed by at least one data elements ($a_0, a_1, \ldots d_2, d_3$), as illustrated in FIG. 7. Ordinarily, the size of the data elements is counted in bit or symbol. The number of the input sequences is identical to the number of the terminals of the first side. As illustrated here, the number of input sequences is 4 since there are 4 terminals (103-1, 103-2, 103-3, 103-4) in the first side.

Step (f):

One control signal for all the nodes is read. In this embodiment, all control signals are read in the order of "00", "10", "01" and "11."

Step (g):

An identical switching operation is performed. In the preceding step (f), a first one of the control signals is "00", therefore, all data flows through nodes of columns (702) and (703) are kept in horizontal directions. That is, all the directions are identical.

Step (h):

At least one part of the data flow is transmitted. In this embodiment, the first ones ($a_0, b_0, c_0, d_0$) of the data elements ($a_0, a_1, \ldots d_2, d_3$) in the input sequences (705, 706, 707, 708) are transmitted. As described in step (g), data flow through nodes of column (702) and (703) are kept horizontally since the first control signal read is "00." As s result, outputted data elements at terminals (103-5, 103-6, 103-7, 103-8) at the second side are also $a_0, b_0, c_0$ and $d_0$, respectively. Step (g) should last for a duration substantially long enough in order to transmit the first ones of the data elements in each of the input sequences. In some embodiments, more than one data elements may be transmitted together, and the duration has to be adjusted accordingly.

The step (g) is repeated by reading another control signal of the control sequences ("00", "10", "01" and "11") in the step (f) after the duration, and then another element in each of the input sequences (705, 706, 707, 708) is transmitted according to the step (h), wherein said another control signal and data element are chosen according to predetermined orders. In this embodiment, another control signal "10" is read (step (0) after the duration for which data elements $a_0, b_0, c_0$ and $d_0$ are transmitted. Accordingly, data flows through nodes of column (702) are set in an oblique direction and data flows through nodes of column (703) are still kept in a horizontal direction (step (g)). In the subsequent step (h), second ones of the data elements in each of input sequences, i.e. data elements $a_1, b_1, c_1$ and $d_1$, are transmitted to the second side and outputted at terminals (103-5, 103-6, 103-7, 103-8) as data elements $C_1, d_1, a_1$ and $b_1$, respectively. The operation is continued until all data elements of the data flow are transmitted.

It is clear that each of the input sequences is assigned to and transmitted through an exclusive terminal of the first side in the step (h). In the present embodiment, an input sequence (705) is assigned to and transmitted through the exclusive terminal (103-1), an input sequence (706) is assigned to and transmitted through the exclusive terminal (103-2), and so forth.

In this embodiment, the number of control signals in the control sequence is 4, which is identical to the number of data elements in each of the input sequences. However, in some cases, the control sequence may be shorter or longer than the length of each of the input sequences for various purposes such as efficiency or security. If a control sequence is shorter than the length of each of the input sequences, at least one of the control signals is read more than once at the step (f), and used by more than one step (g). Take this embodiment for example, the control sequence can be used again from the beginning if all 4 control signals are used and a fifth control signal is requested. On the contrary, at least one of the control signals may not be read in step (f) if the control sequence is longer than the length of each of the input sequences. Whether a control signal is used or not can depend on a security algorithm, for example.

The present method is particularly designed for permutation or de-permutation utilized in channel coding algorithms, wherein the data flow can be permuted in an encoder and permuted/de-permutated in a decoder. Note that permutations and de-permutations can both be performed in the decoder due to the internal algorithm of the decoder. De-permutations are actually performed in the same way as the permutations discussed above. As what can be seen from FIG. 6, the data flow manipulated by said method (permuted sequences (709, 710, 711, 712)) can be de-permuted to be the data flow of step (e) (the input sequences (705, 706, 707, 708)) by repeating said method again by providing a control sequence comprising contents identical to the control sequence. Note that the direction of de-permutation is not necessary from the second side to the first side. It can also be performed from the first side to the second side with the same control sequence, which further simplifies manufacturing and broadens applications because an identical design of the network can be used in both an encoder side and a decoder side.

For the purpose of security, the control sequence can be made different between two or more encoder-decoder pairs, and the control sequence can be applied in turbo code. In the case that multiple encoder-decoder pairs are utilized, an encoder can be repeatedly used in more than one encoder-decoder pairs. LDPC code can apply the same concept to construct a parity-check matrices. In a broad sense the control sequence can also be applied in LDPC code to attain the purpose of heightening security. In such a design, a third party without holding the correct control sequence cannot convert the manipulated data flow into original one, even if the transmission is intercepted between the encoder and decoder. Preferably, the control sequence is encrypted when delivered from the encoder to the decoder. The term "delivered" is not limited to wireless communication. For example, if the encoder is a wireless service provider and the decoder is an user, the control sequence can be delivered to the user by a mailed security data sheet (or card), encrypted Internet connection, and so on.

What is claimed is:

1. A network for channel coding permutation and de-permutation, which comprises a first side and a second side, wherein each of the first side and second side has at least one terminal, the terminals of the first side are a posteriori probability (APP) decoders and the terminals of the second side are memory buffers, said network comprising:

two or more columns of nodes located between the first and second sides, wherein a first column of said columns interfaces the first side, and a second column of said columns interfaces the second side; wherein each of said columns comprises at least one node;

wherein each node of said columns is connected to a first number of nodes in each of adjacent columns next to said columns, and said first number is identical for all the nodes in the network; and wherein the nodes which are selected as switches are concurrently controlled to perform switching operations.

2. The network as claimed in claim 1, wherein each of said columns comprises a second number of nodes and the second number is identical for each of said columns.

3. The network as claimed in claim 1, wherein the terminals of the first side and second side have an exclusive node in the first column and second column respectively, and each of the terminals is connected to each of the exclusive nodes.

4. The network as claimed in claim 1, wherein the nodes which are selected as switches are nodes of the first column, if a predetermined direction of data flow through the network is from the first side to the second side.

5. The network as claimed in claim 1, said network comprising form of an OMEGA network.

6. The network as claimed in claim 1, said network comprising form of a Benes network.

7. The network as claimed in claim 1, said network comprising form of a fat tree network.

8. The network as claimed in claim 1, said network comprising form of a network used in Winograd Fourier Transform.

9. The network as claimed in claim 1, wherein a terminal of the terminals of the first side is combined with another terminal of the first side, and a terminal of the terminals of the second side is combined with another terminal of the second side.

10. The network as claimed in claim 9, wherein the connections between the nodes and the terminals are combined to form a single connection, if said connections overlap and are identical.

11. The network as claimed in claim 1, wherein a node of the nodes in a column of said columns is combined with another node in the same column.

12. The network as claimed in claim 11, wherein the connections between the nodes are combined to form a single connection, if said connections overlap and are identical.

13. The network as claimed in claim 1, wherein each terminal of the first side serves to be connected to a terminal of another network claimed in claim 1 at the second side.

14. The network as claimed in claim 13, wherein the terminal of the first side and the terminal of said another network at the second side are combined together, and serve as a node after the combination.

15. The network as claimed in claim 14, wherein the node after the combination also serves as a buffer.

16. The network as claimed in claim 1, wherein each terminal of the second side serves to be connected to a terminal of another network claimed in claim 1 at the first side.

17. The network as claimed in claim 16, wherein the terminal of the first side and the terminal of said another network at the second side are combined together, and serve as a node after the combination.

18. The network as claimed in claim 17, wherein the node after the combination also serves as a buffer.

19. A network for channel coding permutation and de-permutation, which comprises a first and a second side, wherein each fo the first side and second side has at least one terminal, the terminals of the first side are intra-block permuters and the terminals of the second side are memory buffers, said network comprising:

two or more columns of nodes located between the first and second sides, wherein a first column of said columns interfaces the first side, and a second column of said columns interfaces the second side; wherein each of said columns comprises at least one node;

wherein each node of said columns is connected to a first number of nodes in each of adjacent columns next to said columns, and said first number is identical for all the nodes in the network; and wherein the nodes which are selected as switches are concurrently controlled to perform switching operations.

20. The network of claim 19, wherein each of the terminals of the first side and second side has an exclusive node in the respective first column and second column, and each of the terminals is connected to one of the exclusive nodes.

21. The network as claimed in claim 19, wherein a first terminal of one of the first side and second side is combined with a second terminal of the same side.

22. The network as claimed in claim 19, wherein a first node in one of the two or more columns is combined with a second node in the same column.

23. The network as claimed in claim 19, wherein each terminal of the first side is combined with each terminal of the second side of another network claimed in claim 14.

24. The network as claimed in claim 23, wherein the combination of the terminal of the first side with the terminal of the second side servers as a node.

25. The network as claimed in claim 24, wherein the combination of the terminal of the first side with the terminal of the second side servers as a buffer.

26. A method of operating a network for channel coding permutation and de-permutation, the network comprising: a first side and a second side, wherein each of the first side and second side has at least one terminal, and two or more columns of nodes are located between the first and second sides, wherein a first column of said columns interfaces the first side, and a second column of said columns interfaces the second side; wherein each of said columns comprises at least one node; wherein each node of said columns is connected to a first number of nodes of each of adjacent columns next to said columns, and said first number is identical for all nodes in the network; and wherein the nodes which are selected as switches are concurrently controlled to perform identical switching operations; the method comprising:

determining a direction in which a data flow is effected from the first side to the second side through the network;

determining control elements of control signals, and the quantity of the control elements corresponding to said first number;

associating each of the control elements with one of the switching operations of the nodes which are selected as switches;

providing a control sequence composed of the control signals arranged in a row;

providing a data flow to be manipulated;

reading at least one of the control signals for all the nodes;

performing a switching operation of the switching operations for the nodes according to the control element of the control signals which is read; and transmitting at least one part of the data flow from the first side to the second side through paths established by the switching operations of the nodes.

27. The method as claimed in claim 26, wherein each of the control elements is represented by a binary number.

28. The method as claimed in claim 26, wherein the control elements are numbers within a limited numerical range or set.

29. The method as claimed in claim 26, wherein the quantity of the control elements equals to said first number.

30. The method as claimed in claim 26, wherein the performing a switching operation of the switching operations for the nodes according to the control element of the control signals which is read lasts for a duration substantially long enough in order to transmit at least one data element in each of the input sequences.

31. The method as claimed in claim 26, wherein the data flow is formed by a plurality of input sequences, and each of the input sequences is formed by at least one data element.

32. The method as claimed in claim 31, wherein the number of the input sequences is identical to the number of the terminals of the first side.

33. The method as claimed in claim 31, wherein the size of the data elements is counted in bit or symbol.

34. The method as claimed in claim 26, wherein the performing a switching operation of the switching operations for the nodes according to the control element of the control signals which is read is repeated by reading another control signal of the control sequences in the reading at least one of the control signals for all the nodes after the duration, and then another data element in each of the input sequences is transmitted according to the transmitting at least one part of the data flow from the first side to the second side through paths established by the switching operations of the nodes.

35. The method as claimed in claim 34, wherein said another control signal is chosen according to a predetermined order.

36. The method as claimed in claim 34, wherein said another data element is chosen according to a predetermined order.

37. The method as claimed in claim 34, wherein each of the input sequences is assigned to and transmitted through an exclusive terminal of the first side in the transmitting at least one part of the data flow from the first side to the second side through paths established by the switching operations of the nodes.

38. The method as claimed in claim 34, wherein the number of the data elements of each of the input sequences and the number of the control signals of the control sequence are identical.

39. The method as claimed in claim 34, wherein at least one of the control signals is read more than once in the reading at least one of the control signals for all the nodes, and used by more than once in the performing a switching operation of the switching operations for the nodes according to the control element of the control signals which is read.

40. The method as claimed in claim 34, wherein at least one of the control signals is not read in any of the reading at least one of the control signals for all the nodes.

41. The method as claimed in claim 26, wherein the data flow manipulated by said method can be de-permuted to be the data flow of the providing a data flow to be manipulated by repeating said method again by providing a second control sequence comprising contents identical to said control sequence.

42. The method as claimed in claim 41, wherein the data flow is permuted in an encoder and permuted/de-permuted in a decoder.

43. The method as claimed in claim 41, wherein the control sequence is made different between two or more encoder-decoder pairs.

44. The method as claimed in claim 43, wherein the control sequence is encrypted when delivered from the encoder to the decoder.

45. The method as claimed in claim 44, wherein the control sequence is applied in LDPC.

46. The method as claimed in claim 44, wherein the control sequence is applied in a turbo code.

* * * * *

UNITED STATES PATENT AND TRADEMARK OFFICE
CERTIFICATE OF CORRECTION

| | |
|---|---|
| PATENT NO. | : 7,856,579 B2 |
| APPLICATION NO. | : 11/414433 |
| DATED | : December 21, 2010 |
| INVENTOR(S) | : Zheng |

It is certified that error appears in the above-identified patent and that said Letters Patent is hereby corrected as shown below:

<u>Column 8,</u>

Line 31, "a terminal" should read --a first terminal--;

Line 63, "first" should read --first side--;

Line 64, "fo" should read --of--.

Signed and Sealed this
Twenty-third Day of August, 2011

David J. Kappos
*Director of the United States Patent and Trademark Office*